(12) United States Patent
Li et al.

(10) Patent No.: US 12,062,720 B2
(45) Date of Patent: Aug. 13, 2024

(54) EPITAXIAL SOURCE/DRAIN STRUCTURE AND METHOD OF FORMING SAME

(71) Applicant: Taiwan Semiconductor Manufacturing Co., Ltd., Hsinchu (TW)

(72) Inventors: Kun-Mu Li, Zhudong Township (TW); Hsueh-Chang Sung, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/186,244

(22) Filed: Mar. 20, 2023

(65) Prior Publication Data

US 2023/0231052 A1 Jul. 20, 2023

Related U.S. Application Data

(63) Continuation of application No. 17/199,734, filed on Mar. 12, 2021, now Pat. No. 11,610,994, which is a
(Continued)

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02532* (2013.01); *H01L 21/02573* (2013.01);
(Continued)

(58) Field of Classification Search
CPC .......... H01L 29/7848; H01L 21/02532; H01L 21/02573; H01L 21/823807;
(Continued)

(56) References Cited

U.S. PATENT DOCUMENTS 8,962,400 B2 2/2015 Tsai et al.
9,093,514 B2 7/2015 Tsai et al.
(Continued)

*Primary Examiner* — Karen Kusumakar
*Assistant Examiner* — Adam S Bowen
(74) *Attorney, Agent, or Firm* — Slater Matsil, LLP

(57) ABSTRACT

A semiconductor device and a method of forming the same are provided. The semiconductor device includes a gate stack over an active region and a source/drain region in the active region adjacent the gate stack. The source/drain region includes a first semiconductor layer having a first germanium concentration and a second semiconductor layer over the first semiconductor layer. The second semiconductor layer has a second germanium concentration greater than the first germanium concentration. The source/drain region further includes a third semiconductor layer over the second semiconductor layer and a fourth semiconductor layer over the third semiconductor layer. The third semiconductor layer has a third germanium concentration greater than the second germanium concentration. The fourth semiconductor layer has a fourth germanium concentration less than the third germanium concentration.

20 Claims, 24 Drawing Sheets

Related U.S. Application Data continuation of application No. 16/504,748, filed on Jul. 8, 2019, now Pat. No. 10,950,725.

(60) Provisional application No. 62/738,085, filed on Sep. 28, 2018.

(51) Int. Cl.
*H01L 21/8238* (2006.01)
*H01L 29/167* (2006.01)
*H01L 29/36* (2006.01)
*H01L 29/66* (2006.01)

(52) U.S. Cl.
CPC ........... *H01L 21/823807* (2013.01); *H01L 21/823814* (2013.01); *H01L 29/167* (2013.01); *H01L 29/36* (2013.01); *H01L 29/6681* (2013.01); *H01L 29/785* (2013.01)

(58) Field of Classification Search
CPC ........... H01L 21/823814; H01L 29/167; H01L 29/36; H01L 29/6681; H01L 29/785; H01L 21/02579; H01L 21/0262; H01L 29/161; H01L 29/165; H01L 29/665; H01L 21/823821; H01L 29/0847; H01L 29/66545; H01L 27/0924; H01L 29/41; H01L 29/43

See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,245,805 B2 | 1/2016 | Yeh et al. |
| 9,406,804 B2 | 8/2016 | Huang et al. |
| 9,418,897 B1 | 8/2016 | Ching et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,831,183 B2 | 11/2017 | Lin et al. |
| 9,859,380 B2 | 1/2018 | Lee et al. |
| 9,859,386 B2 | 1/2018 | Ho et al. |
| 10,950,725 B2 | 3/2021 | Li et al. |
| 2013/0178024 A1 | 7/2013 | Flachowsky et al. |
| 2016/0027877 A1* | 1/2016 | Lee .................. H01L 29/66545 438/285 |
| 2016/0027918 A1* | 1/2016 | Kim .................... H01L 29/7848 257/401 |
| 2017/0345933 A1 | 11/2017 | Fung |
| 2018/0122908 A1 | 5/2018 | Balakrishnan et al. |

\* cited by examiner

EPITAXIAL SOURCE/DRAIN STRUCTURE AND METHOD OF FORMING SAME

PRIORITY CLAIM AND CROSS-REFERENCE

This application is a continuation of U.S. patent application Ser. No. 17/199,734, filed on Mar. 12, 2021, now U.S. Pat. No. 11,610,994, issued Mar. 21, 2023, which is a continuation of U.S. patent application Ser. No. 16/504,748, filed on Jul. 8, 2019, now U.S. Pat. No. 10,950,725, issued Mar. 16, 2021, which claims the benefit of U.S. Provisional Application No. 62/738,085, filed on Sep. 28, 2018, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
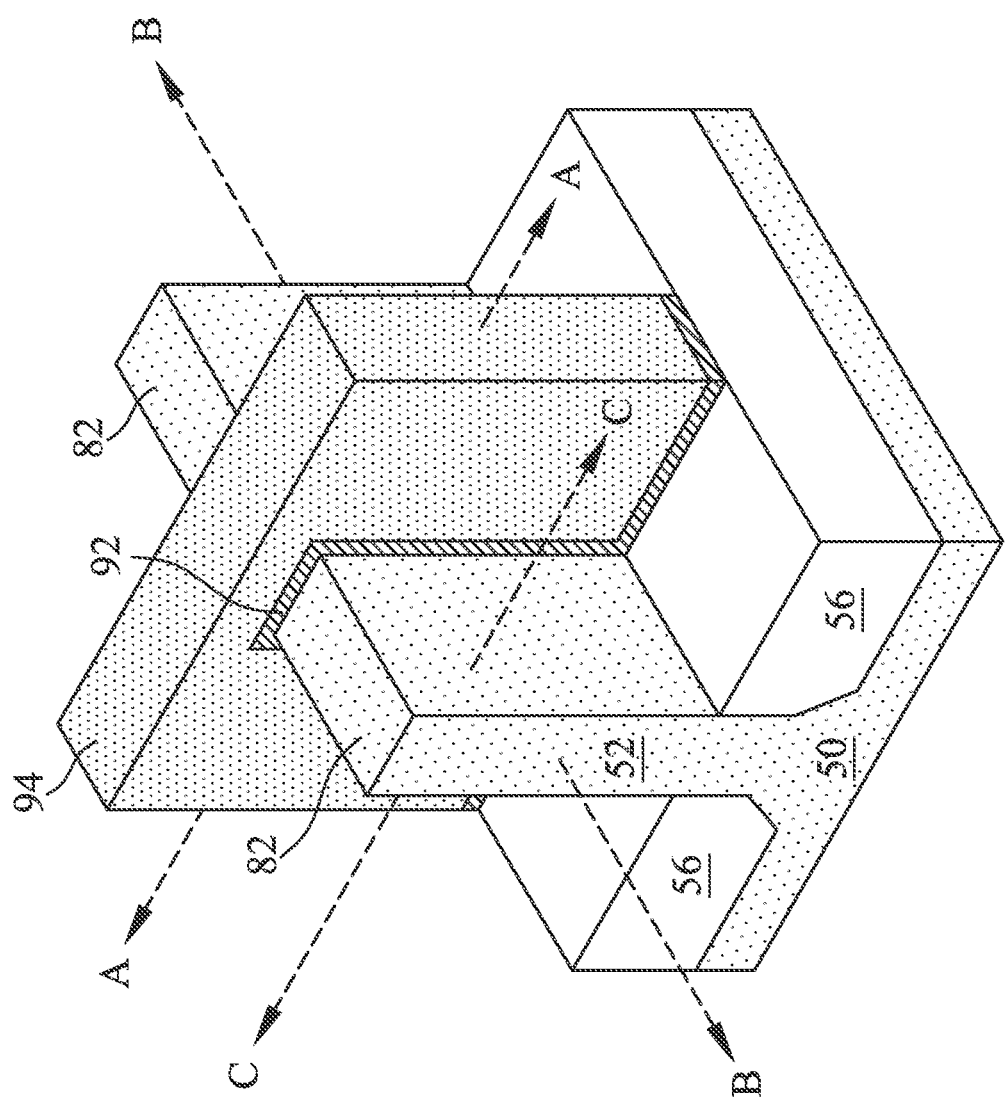
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, source/drain regions of a semiconductor device and a method of forming the same. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around transistor devices, nanowire transistor devices, or the like. Various embodiments discussed herein allow for forming a silicon-germanium ($Si_xGe_{1-x}$, where x can be in the range of 0 to 1) source/drain region comprising a plurality of layers having different concentrations of germanium (Ge) and dopants, such as boron, for example. Various embodiments discussed herein further allow for reducing a source/drain resistance of a semiconductor device and improving a stability of an interface between contacts and the respective source/drain regions.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 10C, 10D, 11B, 11C, 12A, 12B, 13A, 13B, 14A, 14B, 15A, 15B, 15C, 16A, 16B, 17A, and 17B are cross-sectional views of intermediate stages in the manufacturing of FinFETs, in accordance with some embodiments. FIGS. 2 through 7 illustrate the reference cross-section A-A illustrated in FIG. 1, except for multiple fins/FinFETs. FIGS. 8A, 9A, 10A, 12A, 13A, 14A, 15A, 16A, and 17A are illustrated along the reference cross-section A-A illustrated in FIG. 1, and FIGS. 8B, 9B, 10B, 11B, 12B, 13B, 14B, 15B, 15C, 15B, 16B and 17B are illustrated along a similar cross-section B-B illustrated in FIG. 1, except for multiple fins/FinFETs. FIGS. 10C, 10D, and 11 are illustrated along the reference cross-section C-C illustrated in FIG. 1, except for multiple fins/FinFETs.

Figure 2:
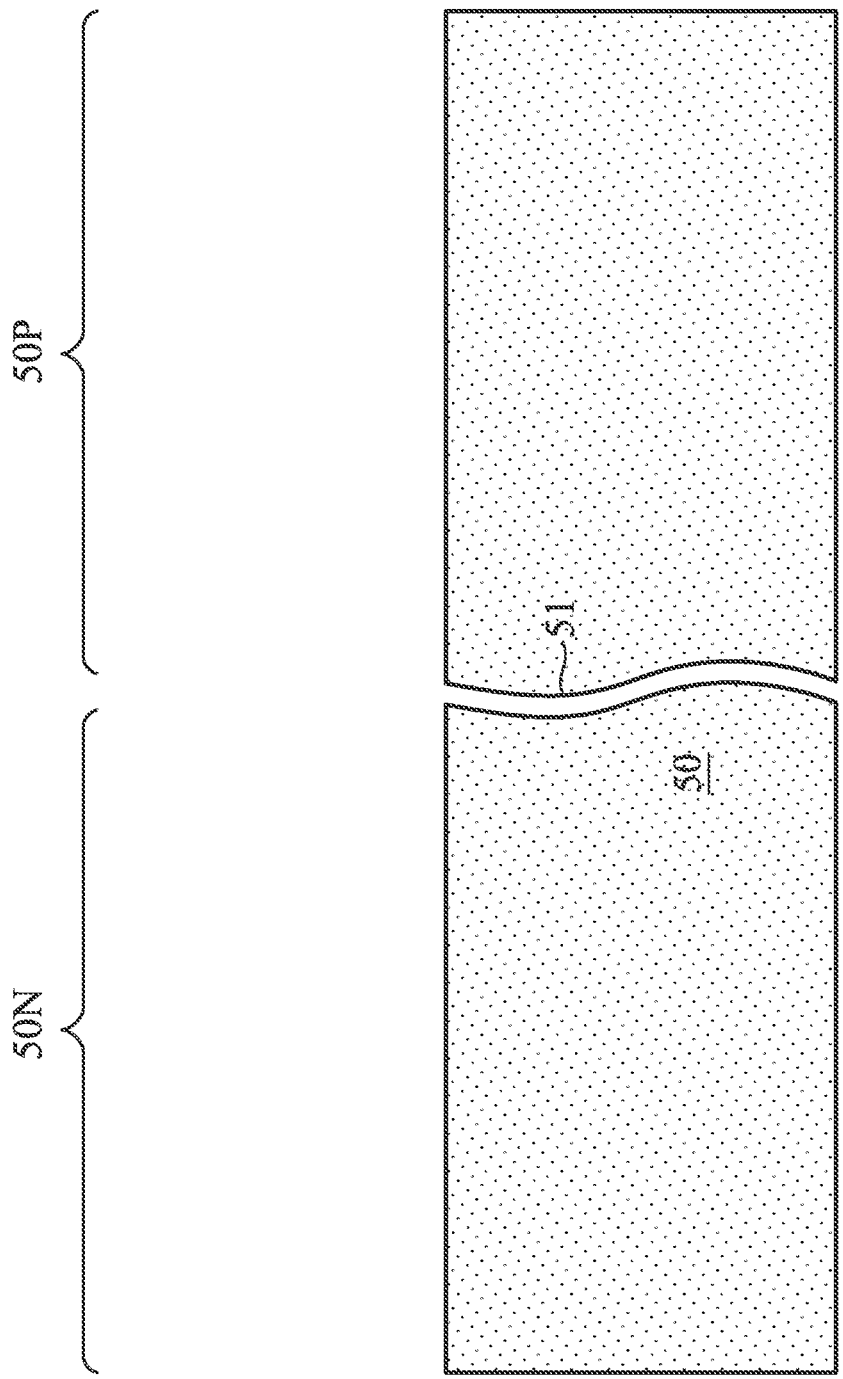
FIGS. 2, 3, 4, 5, 6, 7, 8A, 8B, 9A, 9B, 10A, 10B, 10C, 10D, 11B, 11C, 12A, 12B, 13A, 13B, 14A, 14B, 15A, 15B, 15C, 16A, 16B, 17A, and 17B are cross-sectional views of intermediate stages in the manufacturing of FinFETs in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P.

Figure 3:
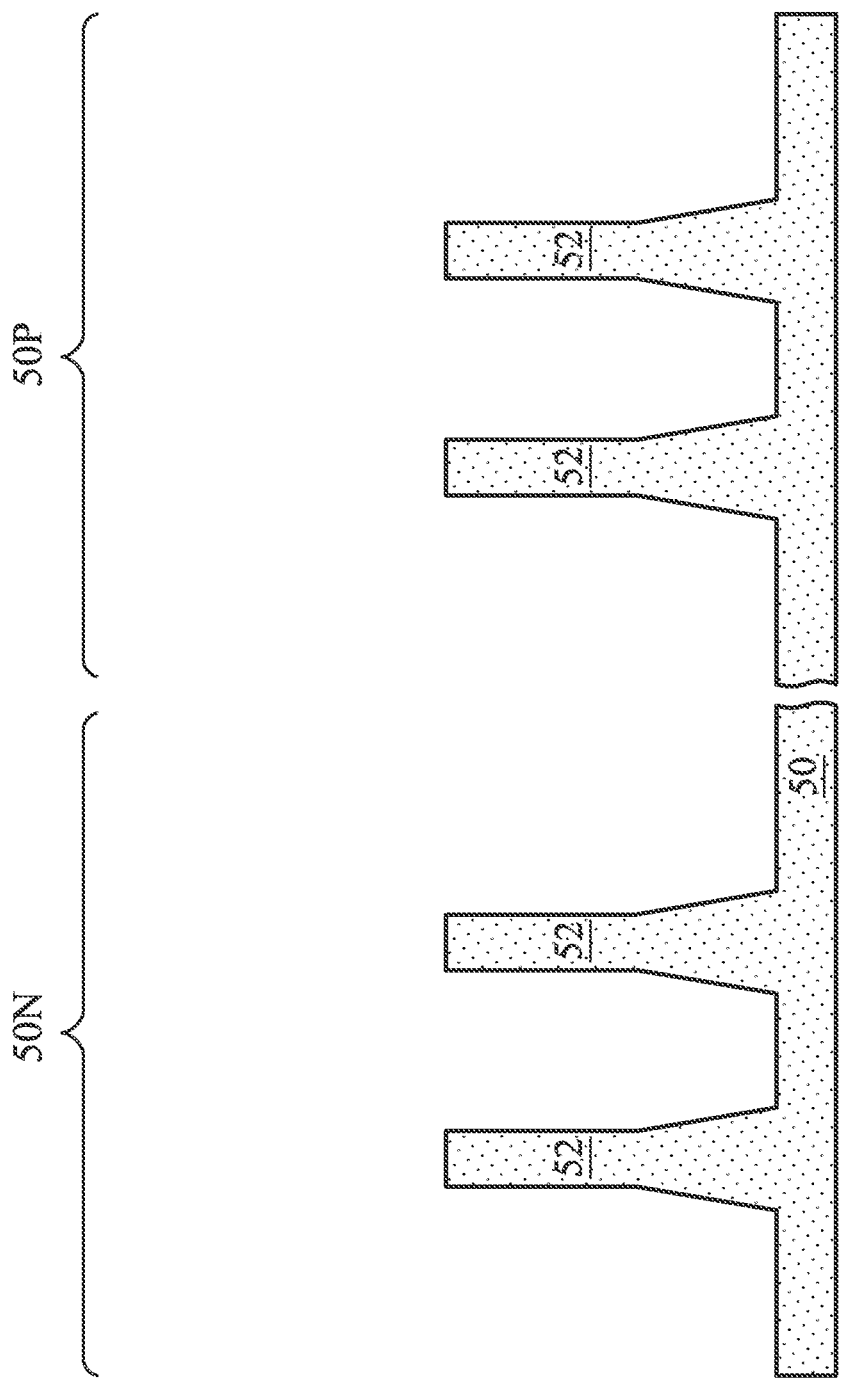

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
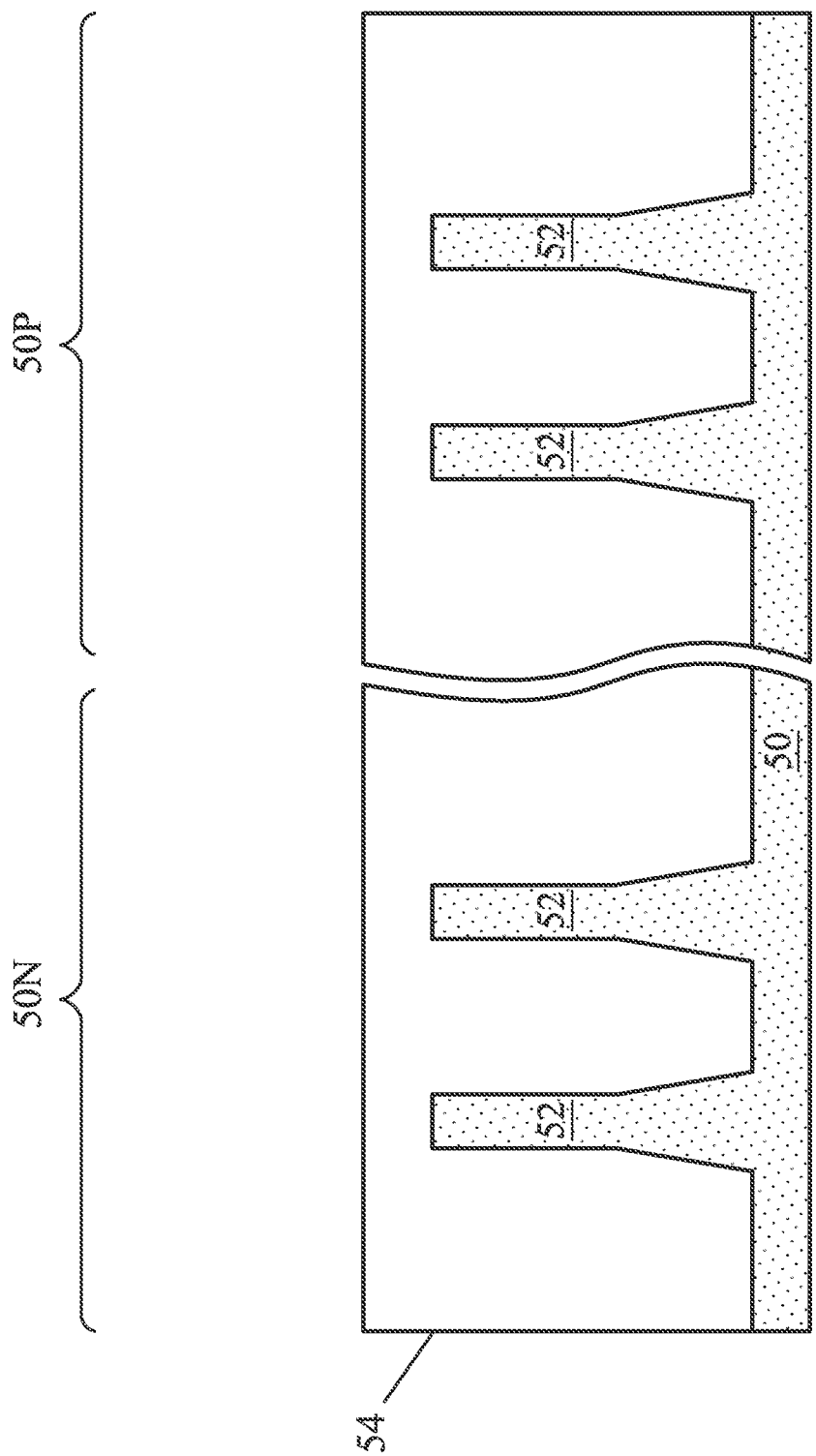

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
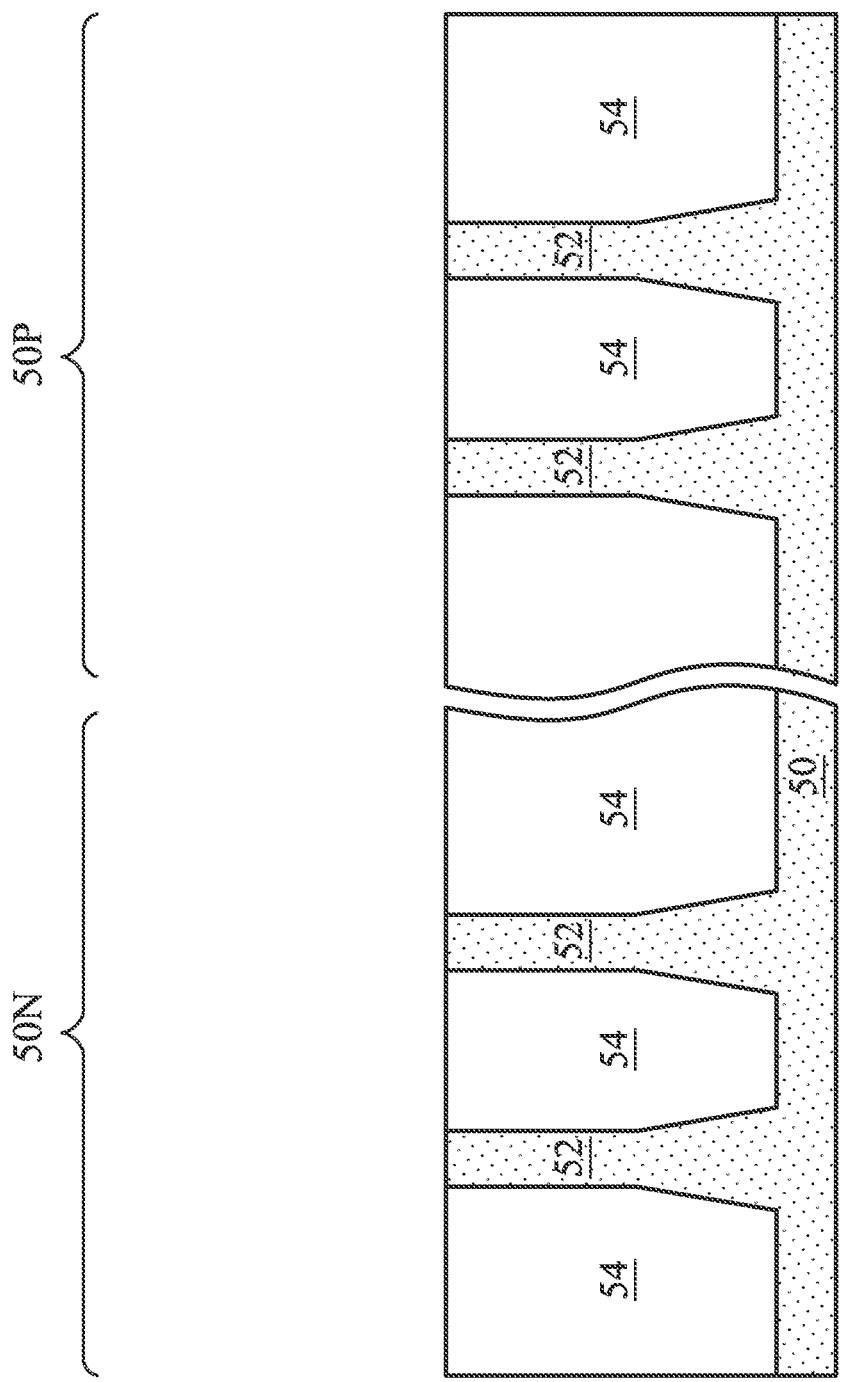

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
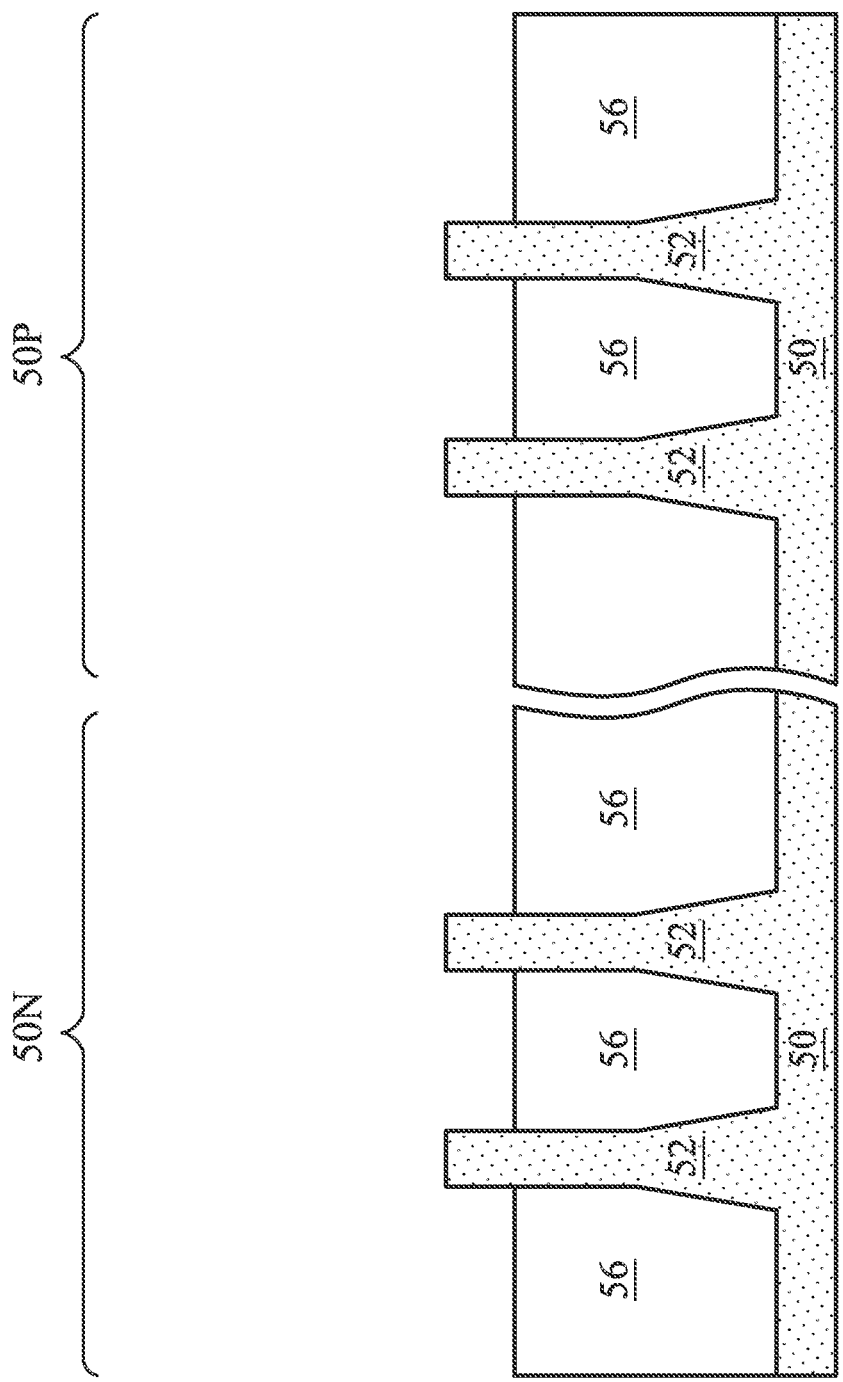

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implantation is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{17}$ cm$^{-3}$ and about $10^{18}$ cm$^{-3}$. After the implantation, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implantation may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ cm$^{-3}$, such as between about $10^{17}$ cm$^{-3}$ and about $10^{18}$ cm$^{-3}$. After the implantation, the photoresist may be removed, such as by an acceptable ashing process.

After performing the implantations of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
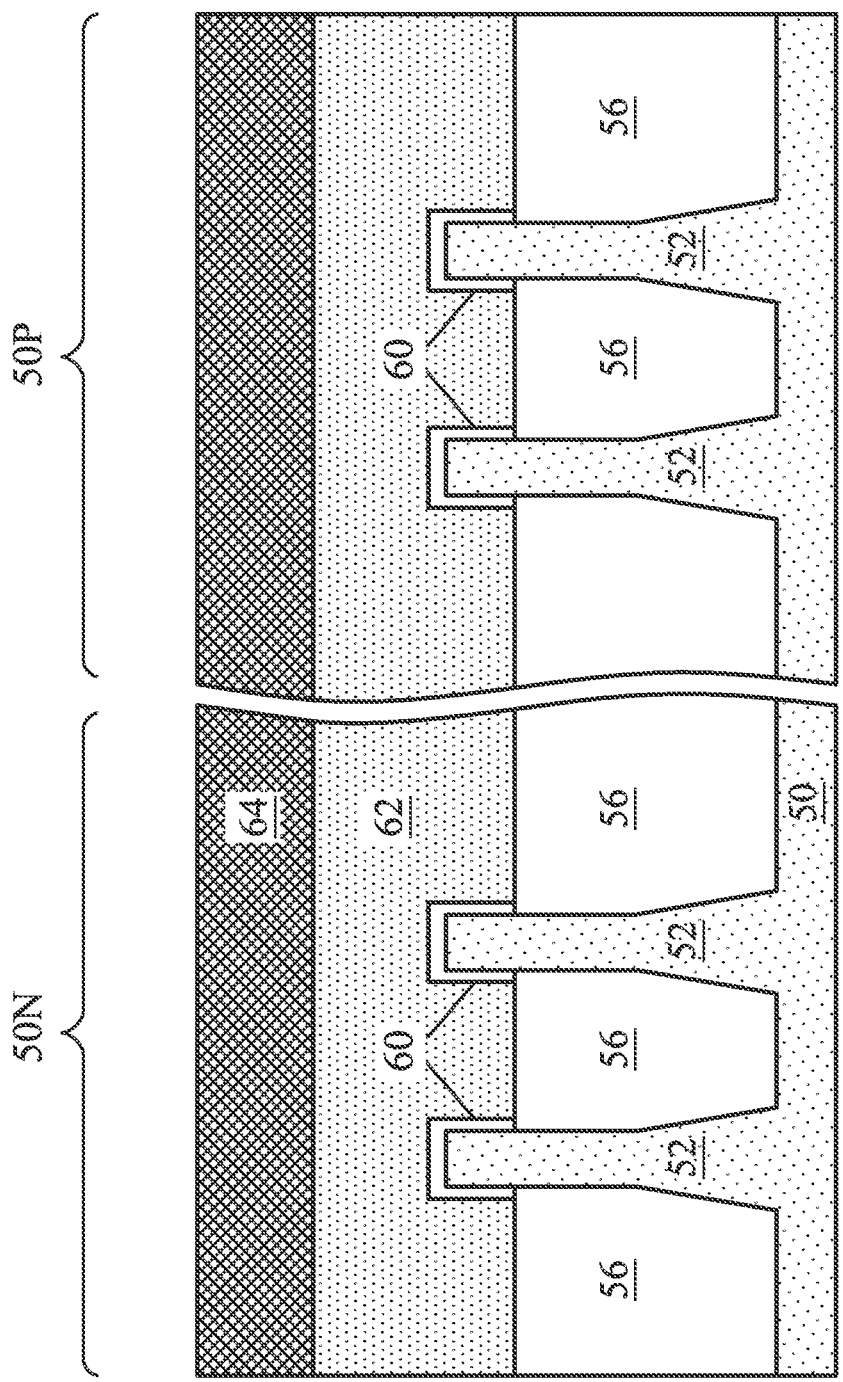

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A, 8B, 9A, 9B, 10A, 10B, 10C, 10D, 11B, 11C, 12A, 12B, 13A, 13B, 14A, 14B, 15A, 15B, 15C, 16A, 16B, 17A, and 17B illustrate various additional steps in the manufacturing of embodiment devices. FIGS. 8A, 8B, 9A, 9B, 10A, 10B, 10C, 10D, 12A, 12B, 13A, 13B, 14A, 14B, 15A, 15B, 15C, 16A, 16B, 17A, and 17B illustrate features in either of the region 50N and the region 50P. For example, the structures illustrated in FIGS. 8A, 8B, 9A, 9B, 10A, 10B, 10C, 10D, 12A, 12B, 13A, 13B, 14A, 14B, 15A, 15B, 15C, 16A, 16B, 17A, and 17B may be applicable to both the region 50N and the region 50P. Differences (if any) in the structures of the region 50N and the region 50P are described in the text accompanying each figure. FIGS. 11B and 11C illustrate features in the region 50P.

Figure 8B:
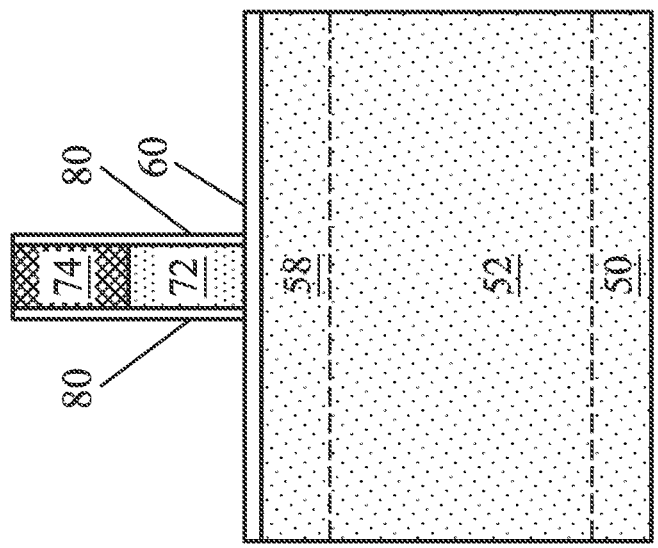
Figure 8A:
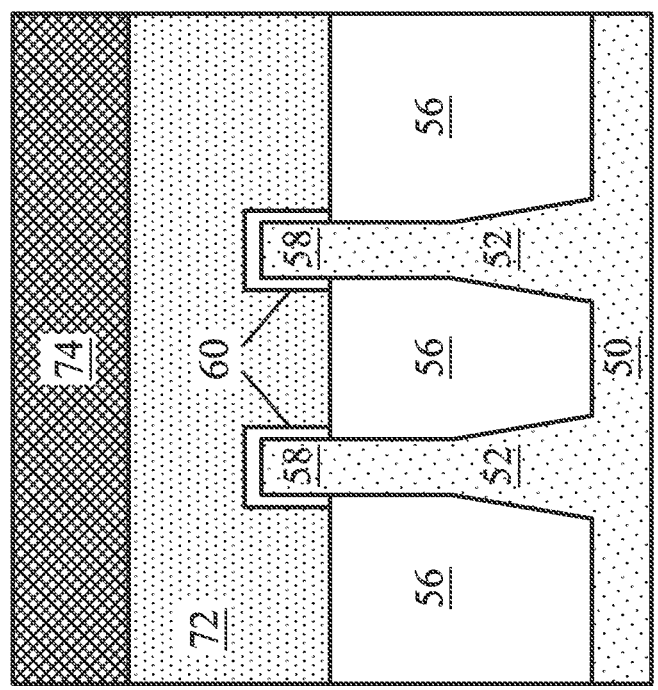

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52. As described below in greater detail, the dummy gates 72 are sacrificial gates and are subsequently replaced by replacement gates. Accordingly, dummy gates 72 may also be referred to as sacrificial gates. In other embodiments, dummy gates 72 are not replaced and remain in the final structure of the resulting FinFET device.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may form the gate seal spacers 80. After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
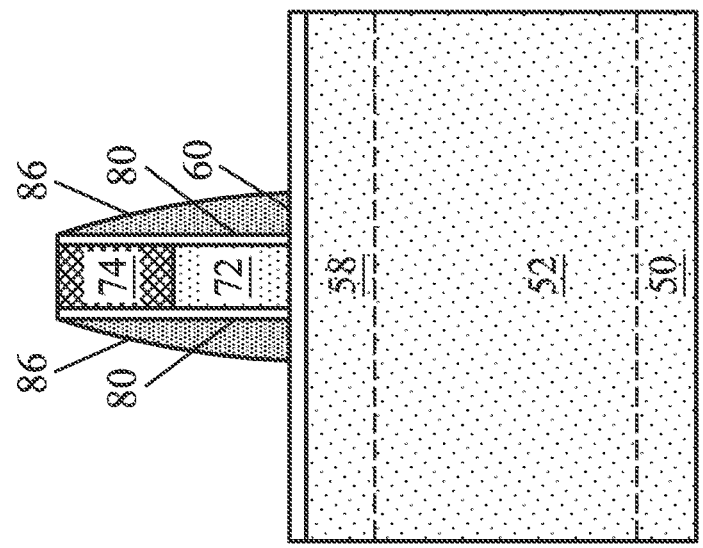
Figure 9A:
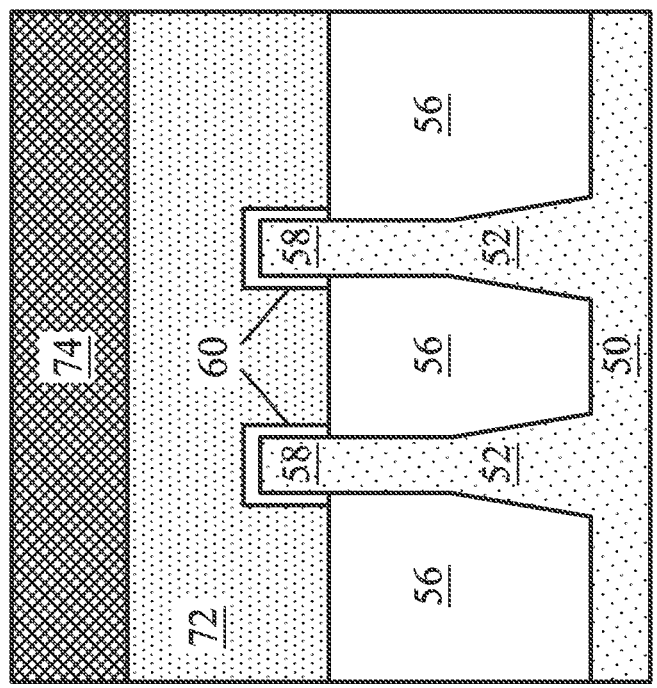

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, SiOC, SiOCN, a combination thereof, or the like. In some embodiments, the gate spacers 86 may comprise a plurality of layers (see, for example, FIGS. 11B and 11C), such that the layers comprise different materials.

In FGIS. 10A and 10B epitaxial source/drain regions 82 are formed in the fins 52 to exert stress in the respective channel regions 58, thereby improving device performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 10C. In other embodiments, adjacent epitaxial source/drain regions 82 remain separated after the epitaxy process is completed as illustrated by FIG. 10D.

Figure 10B:
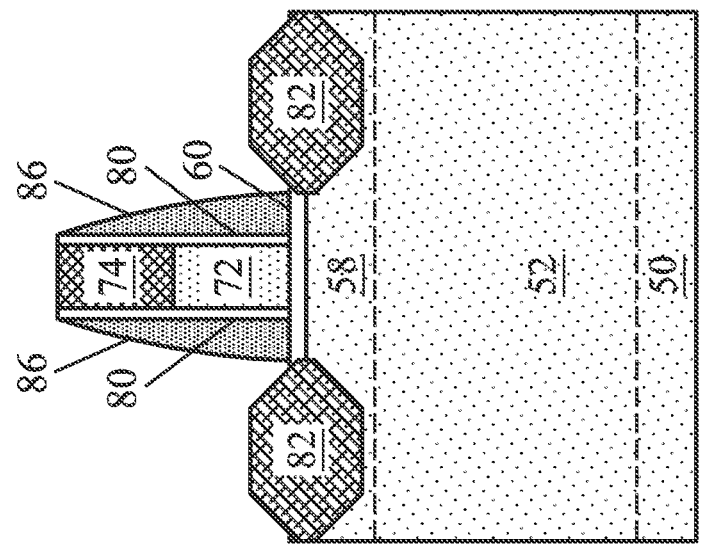
Figure 10A:
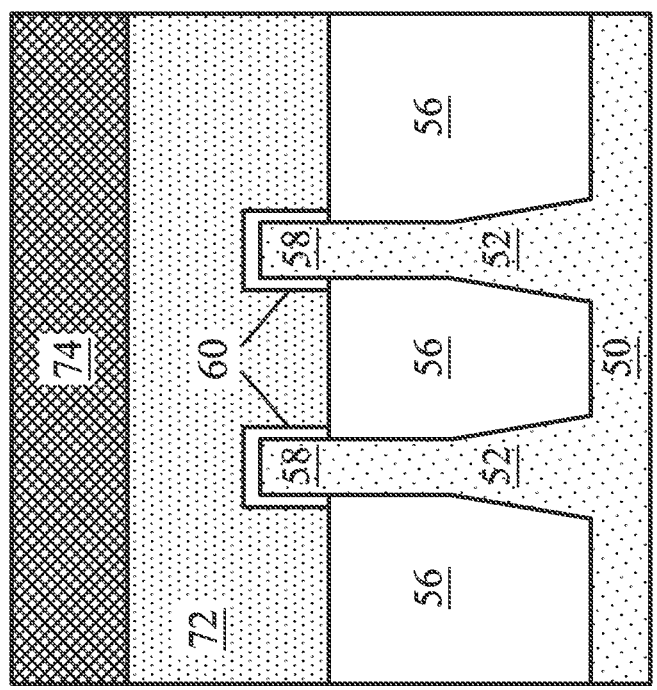
Figure 10C:
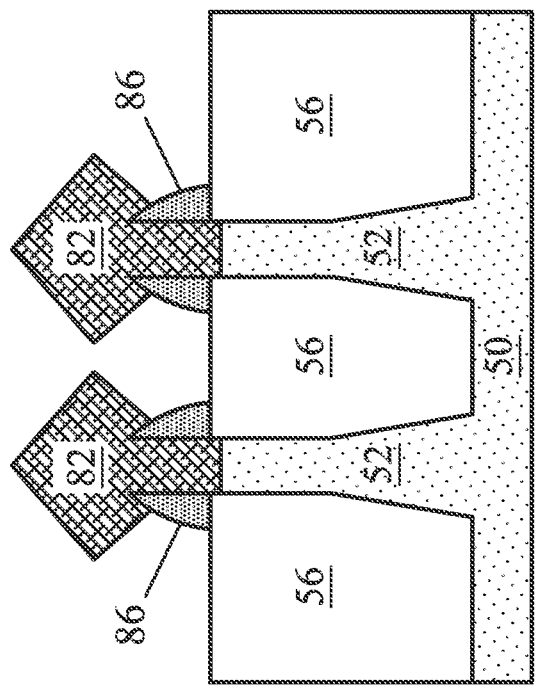
Figure 10D:
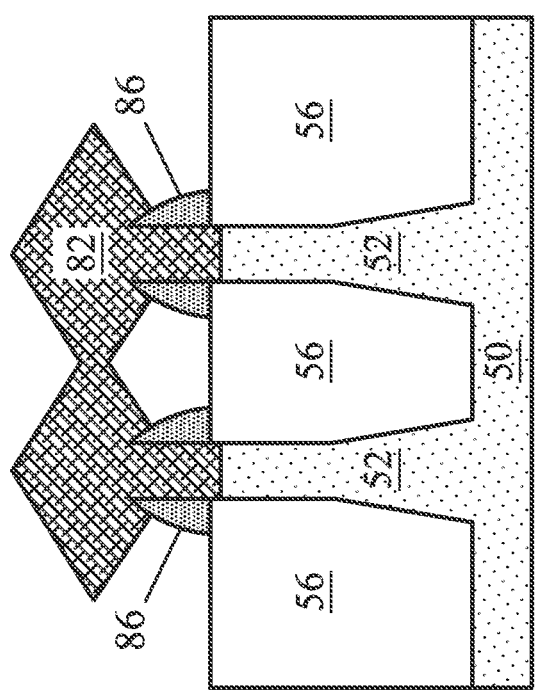
Figure 11B:
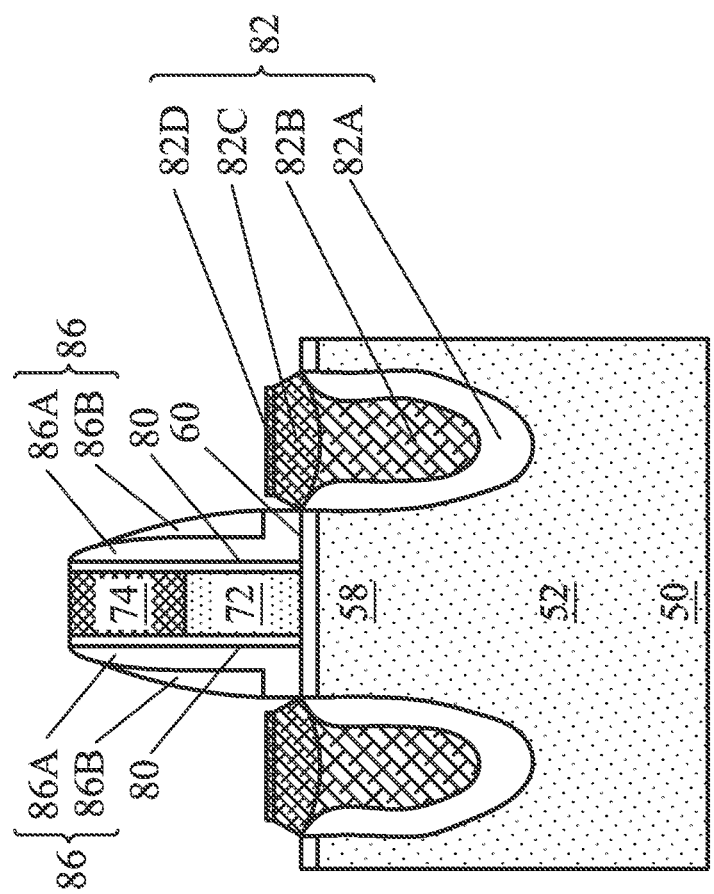
Figure 11C:
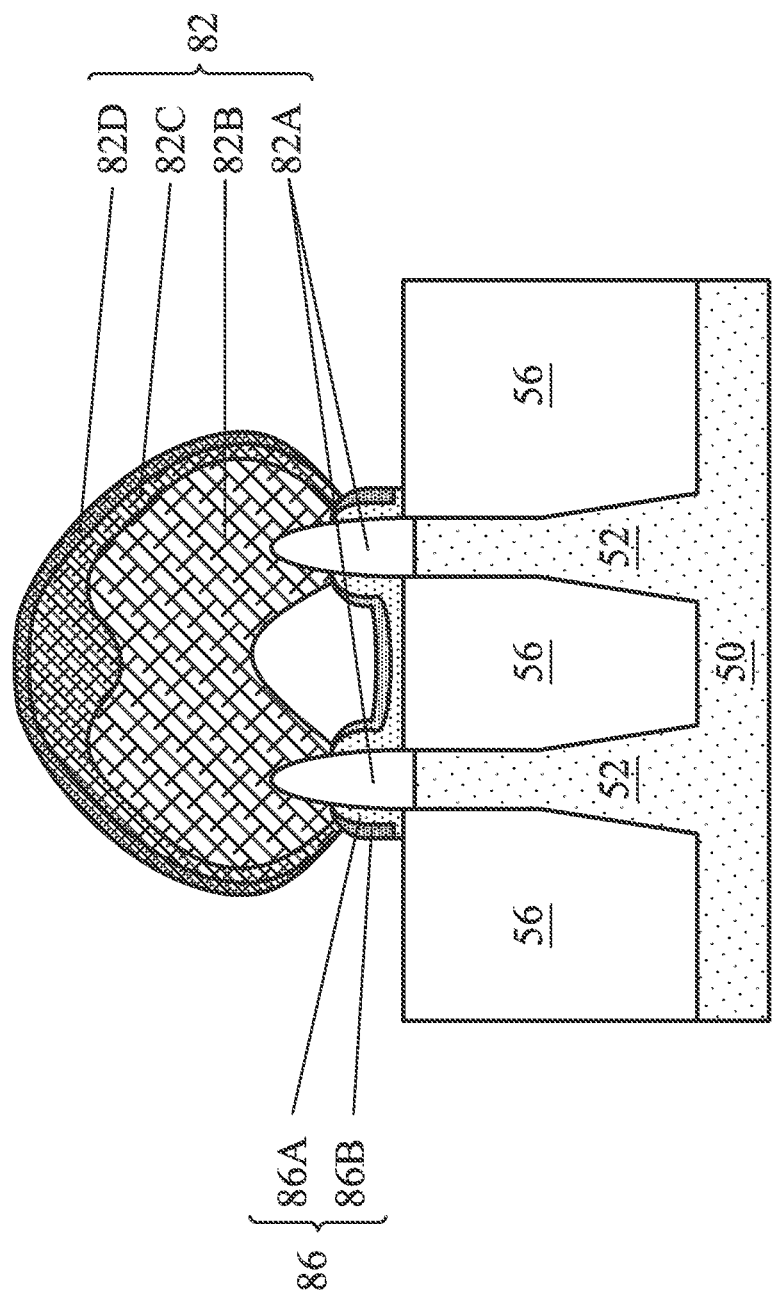

In FIGS. 11B and 11C, details of a structure shown in FIGS. 10B and 10C, respectively, are illustrated in the region 50P in accordance with some embodiments. The gate spacers 86 may comprise a plurality of layers, such as layers 86A and 86B. In some embodiments, the layers 86A and 86B comprise different materials. In some embodiments, the anisotropic etching process described above with reference to FIGS. 9A and 9B may not fully remove horizontal portions of the layers 86A and 86B from the isolation regions 56 between adjacent fins 52. In such embodiments, top surfaces of the isolation regions 56 between adjacent fins 52 are covered by unremoved horizontal portions of the layers 86A and 86B.

Referring further to FIGS. 11B and 11C, the epitaxial source/drain regions 82 in the region 50P comprise silicon germanium (Si$_x$Ge$_{1-x}$, where x can be in the range of 0 to 1) doped with boron (B). In some embodiments, each of the epitaxial source/drain regions 82 comprises a first layer 82A, a second layer 82B, a third layer 82C, and a fourth layer 82D. The second layer 82B may also be referred to as a diffusion barrier layer. The third layer 82C may also be referred to as a high concentration layer. The fourth layer 82D may also be referred to as a cap layer or a protection layer. In some embodiments, a thickness of the fourth layer 82D is less than about 5 nm.

In some embodiments, the first layer 82A has a plurality of disconnected portions corresponding to respective fins 52. In some embodiments, the first layer 82A has a Ge concentration between about 0 atomic percent (at %) and 40 at %. In some embodiments, the first layer 82A has a B concentration between about 1E19 atoms/cm$^3$ and 1E21 atoms/cm$^3$. In some embodiments, the second layer 82B is a continuous layer extending between the disconnected portions of the first layer 82A. In some embodiments, the second layer 82B has a non-planar top surface. In some embodiments, the second layer 82B has a Ge concentration between about 20 at % and about 80 at %. In some embodiments, the second layer 82B has a B concentration between about 1E20 atoms/cm$^3$ and 5E21 atoms/cm$^3$. In some embodiments, the third layer 82C is a continuous layer lining an outer surface of the second layer 82B. In some embodiments, a portion of the third layer 82C extends into the second layer 82B, such that the portion of the third layer 82C is interposed between portions of the second layer 82B. In some embodiments, the third layer 82C has a Ge concentration between about 20 at % and about 100 at %. In some embodiments, the third layer 82C has a B concentration between about 5E20 atoms/cm$^3$ and 1E22 atoms/cm$^3$. In some embodiments, the fourth layer 82D is a continuous layer lining an outer surface of the third layer 82C. In some embodiments, the fourth layer 82D has a Ge concentration between about o at % and about 40 at %. In some embodiments, the fourth layer 82D has a B concentration between about 5E19 atoms/cm$^3$ and 1E21 atoms/cm$^3$.

In some embodiments, the Ge concentration of the second layer 82B is greater than the Ge concentration of the first layer 82A. In some embodiments, the B concentration of the second layer 82B is greater than the B concentration of the first layer 82A. In some embodiments, the Ge concentration of the third layer 82C is greater than the Ge concentration of the second layer 82B. In some embodiments, the B concentration of the third layer 82C is greater than the B concentration of the second layer 82B. In some embodiments, the Ge concentration of the fourth layer 82D is less than the Ge concentration of the third layer 82C. In some embodiments, the B concentration of the fourth layer 82D is less than the B concentration of the third layer 82C.

In some embodiments, the epitaxial source/drain regions 82 are epitaxially grown using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments where the epitaxial source/drain regions 82 are formed of silicon germanium doped by boron, the epitaxial growth process uses a suitable Si precursor, a suitable Ge precursor, and a suitable B precursor. The B precursor provides boron source for in situ doping the epitaxial source/drain regions 82 during the epitaxial growth process. In some embodiments, the suitable Si precursor may be silane (SiH$_4$), dichlorosilane (DCS), disilane (Si$_2$H$_6$), a combination thereof, or the like. In some embodiments, the suitable Ge precursor may be germanium tetrahydride (GeH$_4$), digermane (Ge$_2$H$_6$), combination thereof, or the like. In some embodiments, the suitable B precursor may be diborane (B$_2$H$_6$), or the like. In some embodiments, a flow rate of the Si precursor is between about 0 sccm and about 1000 sccm. In some embodiments, a flow rate of the Ge precursor is between about 0 sccm and about 1000 sccm. In some embodiments, a flow rate of the B precursor is between about 0 sccm and about 500 sccm. In some embodiments, the epitaxial growth process is performed at a temperature between about 400° C. and 800° C. In some embodiments, the epitaxial growth process is performed at a pressure between about 0.1 Torr and 300 Torr.

In some embodiments, the first layer 82A, the second layer 82B, the third layer 82C and the fourth layer 82D may be epitaxially grown by varying, for example, the temperature and the flow rates of the Si, Ge, and B precursors to obtain desired concentrations of Ge and B within the first layer 82A, the second layer 82B, the third layer 82C, and the fourth layer 82D. In some embodiments, the epitaxial growth process for forming the first layer 82A is performed at a temperature between about 400° C. and about 800° C., with a ratio of the flow rate of the Ge precursor to the flow rate of the Si precursor between about 1 and about 4, and with a ratio of the flow rate of the B precursor to the flow rate of the Si precursor between about 0.1 and about 1. In some embodiments, the epitaxial growth process for forming the second layer 82B is performed at a temperature between about 400° C. and about 800° C., with a ratio of the flow rate of the Ge precursor to the flow rate of the Si precursor between about 1 and about 25, and with a ratio of the flow rate of the B precursor to the flow rate of the Si precursor between about 0.1 and about 5. In some embodiments, the epitaxial growth process for forming the third layer 82C is performed at a temperature between about 400° C. and about 800° C., with a ratio of the flow rate of the Ge precursor to the flow rate of the Si precursor between about 10 and about 40, and with a ratio of the flow rate of the B precursor to the flow rate of the Si precursor between about 1 and about 10. In some embodiments, the epitaxial growth process for forming the fourth layer 82D is performed at a temperature between about 400° C. and about 800° C., with a ratio of the flow rate of the Ge precursor to the flow rate of the Si precursor between about 1 and about 4, and with a ratio of the flow rate of the B precursor to the flow rate of the Si precursor between about 0.1 and about 1.

Figure 12B:
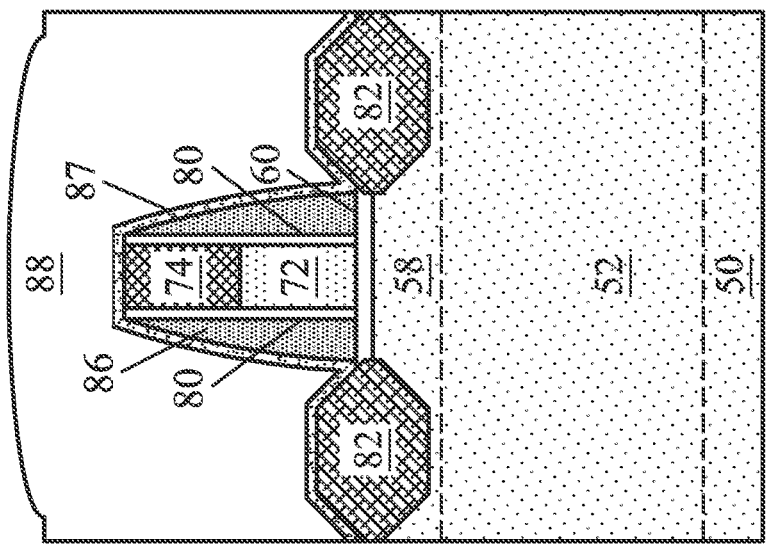
Figure 12A:
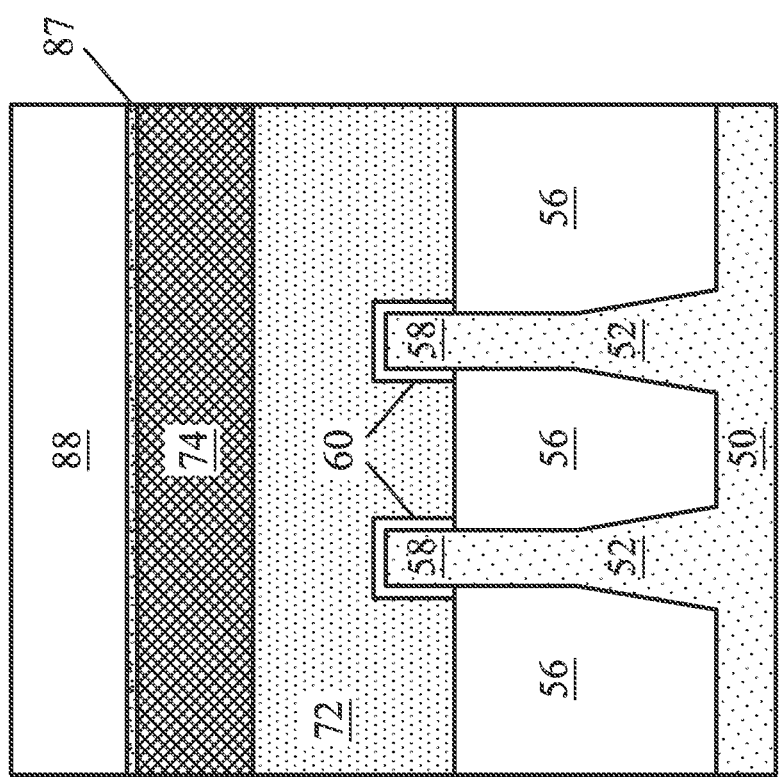

In FIGS. 12A and 12B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 13B:
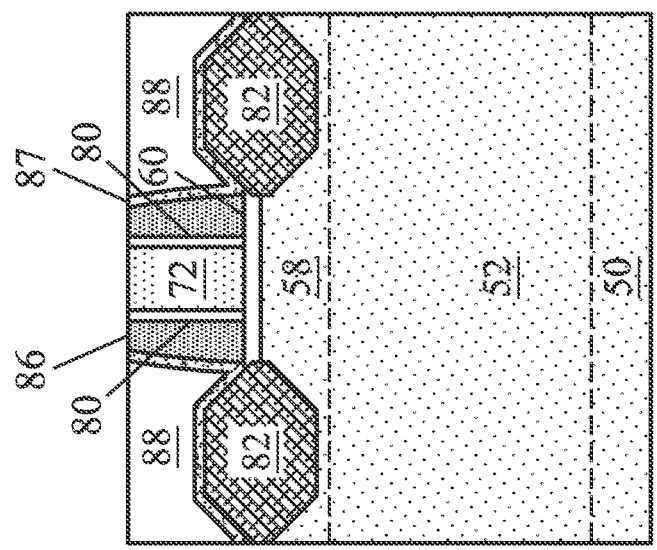
Figure 13A:
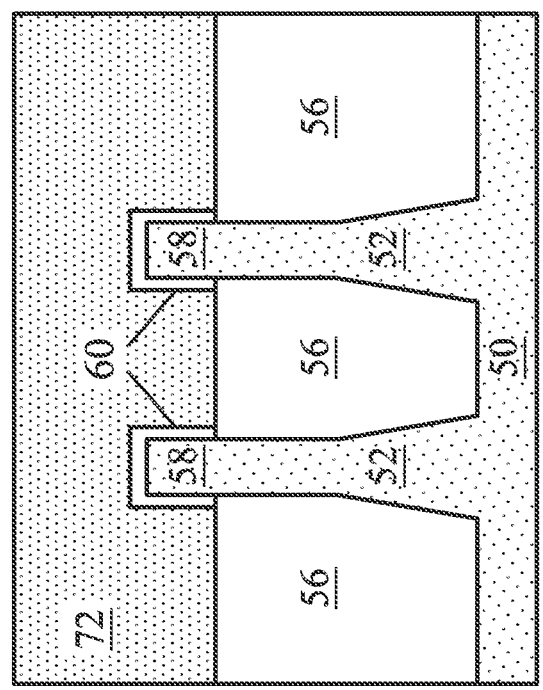

In FIGS. 13A and 13B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 14B:
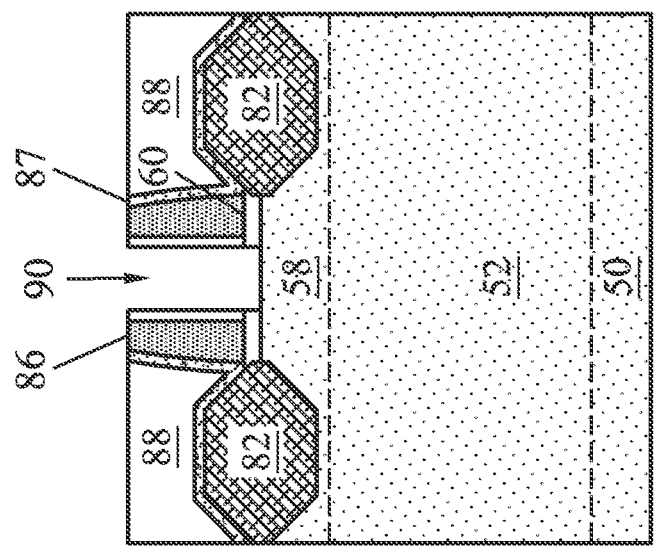
Figure 14A:
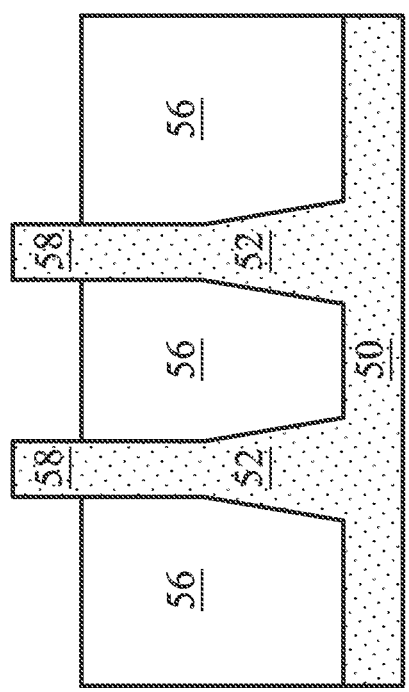

In FIGS. 14A and 14B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from the recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 15B:
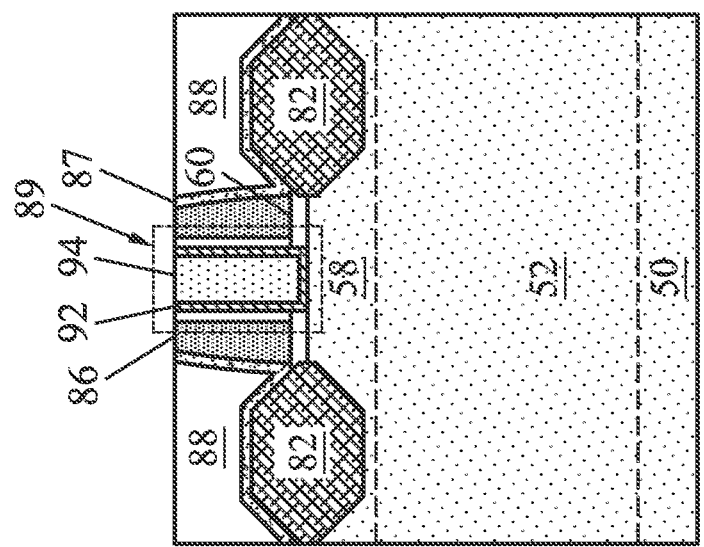
Figure 15A:
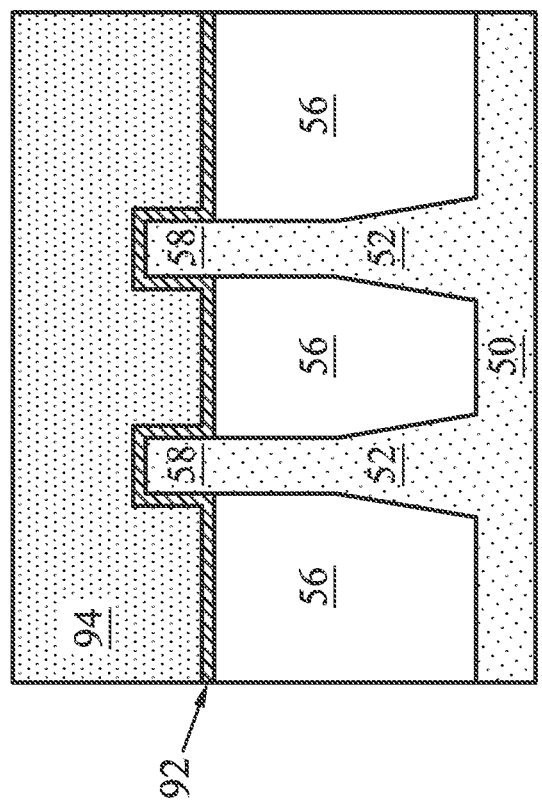
Figure 15C:
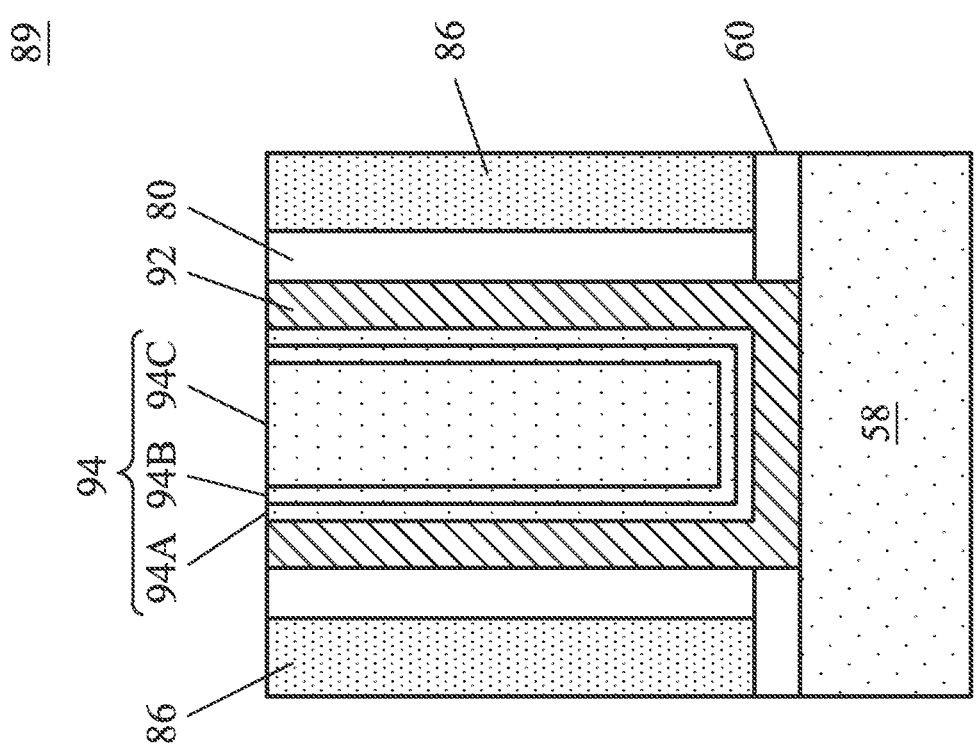

In FIGS. 15A and 15B, gate dielectric layers 92 and gate electrodes 94 are formed for replacement gates. FIG. 15C illustrates a detailed view of a region 89 of FIG. 15B. The gate dielectric layers 92 are deposited conformally in the recesses 90 (see FIGS. 14A and 14B), such as on the top surfaces and the sidewalls of the fins 52 and on sidewalls of the gate seal spacers 80/gate spacers 86. The gate dielectric layers 92 may also be formed on top surface of the first ILD 88. In some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90 (see FIGS. 14A and 14B). For example, although a single layer gate electrode 94 is illustrated in FIG. 15B, the gate electrode 94 may comprise any number of liner layers 94A, any number of work function tuning layers 94B, and a fill material 94C as illustrated by FIG. 15C. The liner layers 94A may include TiN, TiO, TaN, TaC, combinations thereof, multi-layers thereof, or the like. In region 50N, the work function tuning layers 94B may include Ti, Ag, Al, TiAl, TiAlN, TiAlC, TaC, TaCN, TaSiN, TaAlC, Mn, Zr, combinations thereof, multi-layers thereof, or the like. In region 50P, the work function tuning layers 94B may include TiN, WN, TaN, Ru, Co, combinations thereof, multi-layers thereof, or the like. The fill material 94C may include Co, Ru, Al, Ag, Au, W, Ni, Ti, Cu, Mn, Pd, Re, Ir, Pt, Zr, alloys thereof, combinations thereof, multi-layers thereof, or the like. After the filling of the gate electrodes 94, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of the channel regions 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 16B:
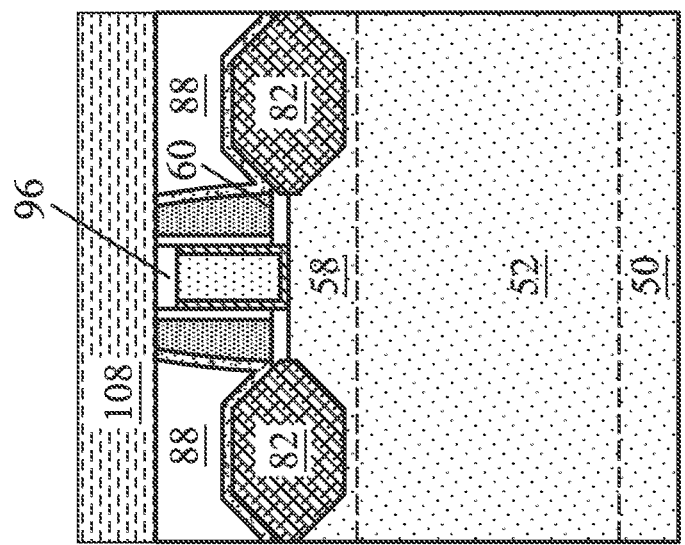
Figure 16A:
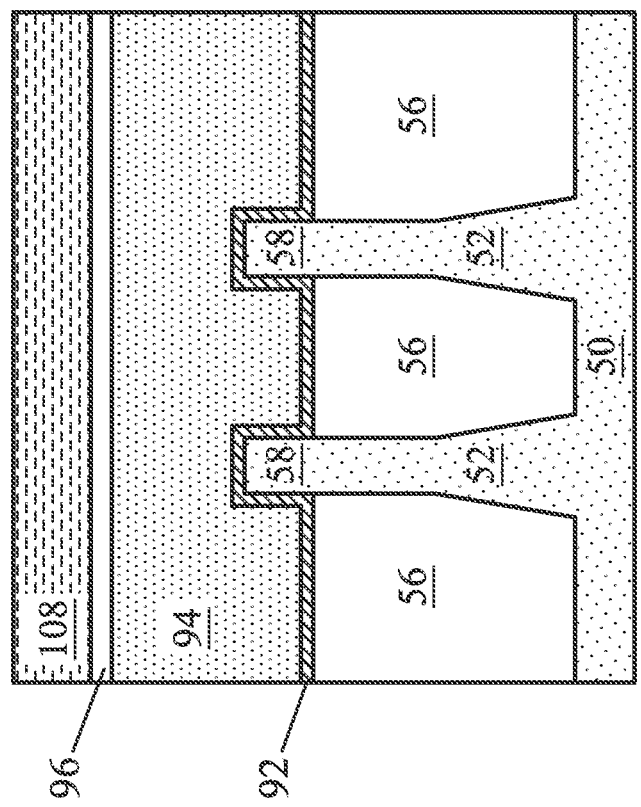

In FIGS. 16A and 16B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 16A and 16B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (see FIGS. 17A and 17B) penetrate through the gate mask 96 to contact the top surface of the recessed gate electrode 94.

Figure 17B:
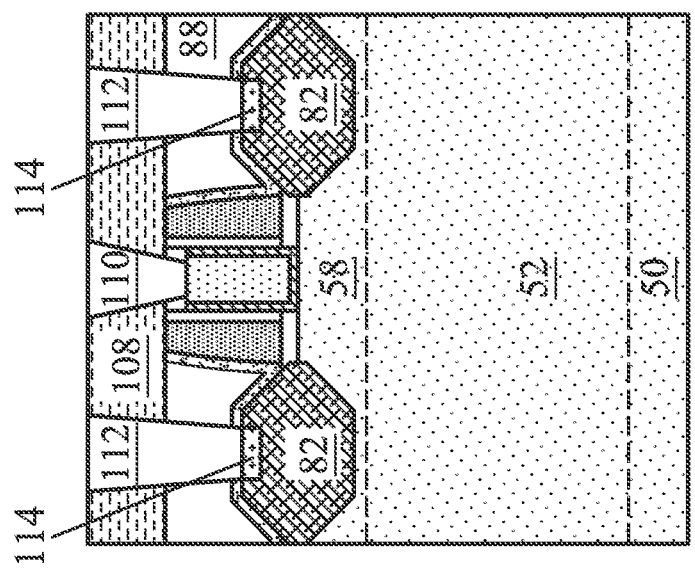
Figure 17A:
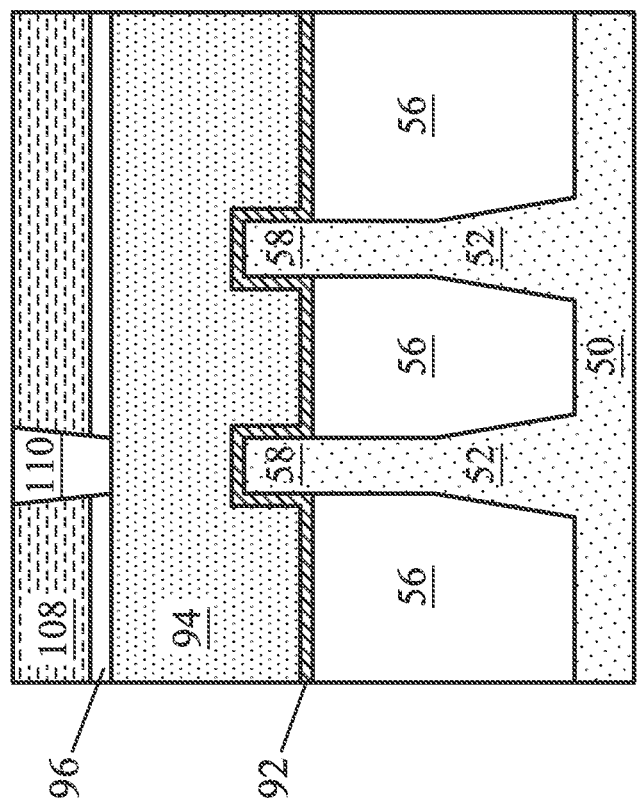

In FIGS. 17A and 17B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. After forming the openings for the source/drain contacts 112, silicide layers 114 are formed through the openings for the source/drain contacts 112. In some embodiments, a metallic material is deposited in the openings for the source/drain contacts 112. The metallic material may comprise Ti, Co, Ni, NiCo, Pt, NiPt, Ir, PtIr, Er, Yb, Pd, Rh, Nb, a combination thereof, or the like, and may be formed using PVD, sputtering, or the like. Subsequently, an annealing process is performed to form the silicide layers 114. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 114, unreacted portions of the metallic layer are removed using a suitable removal process. Subsequently, a liner, such as a diffusion barrier layer, an adhesion layer, or the like, and a conductive material are formed in the openings for the source/drain contacts 112 and in the openings for the gate contacts 110. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 18C:
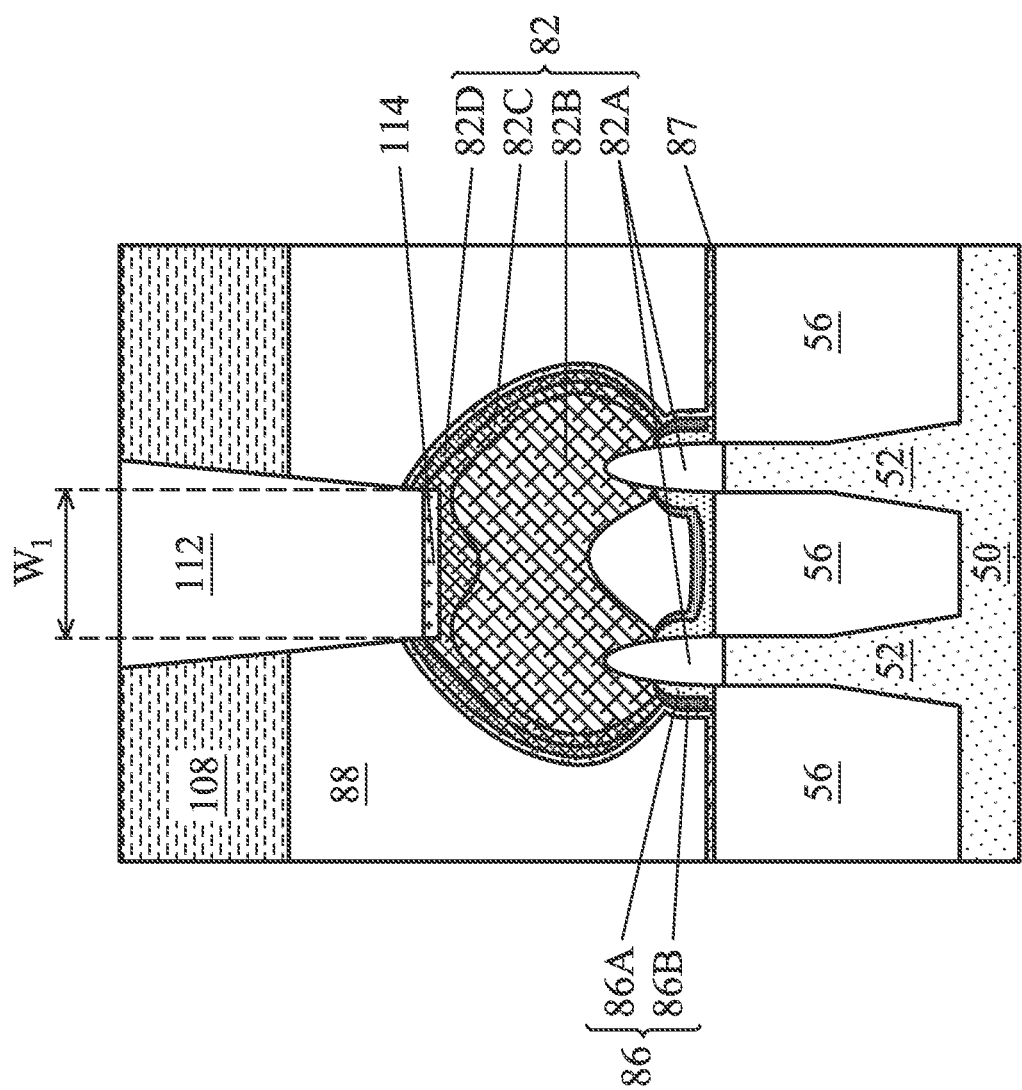
FIG. 18C is a cross-sectional view of a FinFET in accordance with some embodiments.

In FIG. 18C, details of a structure shown in FIGS. 17A and 17B, respectively, are illustrated in the region 50P in accordance with some embodiments. FIG. 18C is illustrated along the reference cross-section C-C illustrated in FIG. 1. In some embodiments, openings for the source/drain contacts 112 are formed such that the openings extend into the respective epitaxial source/drain regions 82. In some embodiments, each of the openings extends through the fourth layer 82D and exposes the third layer 82C of a respective epitaxial source/drain region 82. In other embodiments, each of the openings may partially extend into the third layer 82C of a respective epitaxial source/drain region 82. In some embodiments, the source/drain contacts 112 are electrically coupled to the third layer 82C though the silicide layers 114. Since the third layer 82C is a layer having high concentrations of Ge and B, the resistance of the epitaxial source/drain regions 82 is reduced. A width $W_1$ of the source/drain contact 112 at an interface between the source/drain contact 112 and the respective epitaxial source/drain region 82 may approximately equal to a pitch of the fins 52. In some embodiments, the width $W_1$ is between about 20 nm and about 60 nm.

Figure 19C:
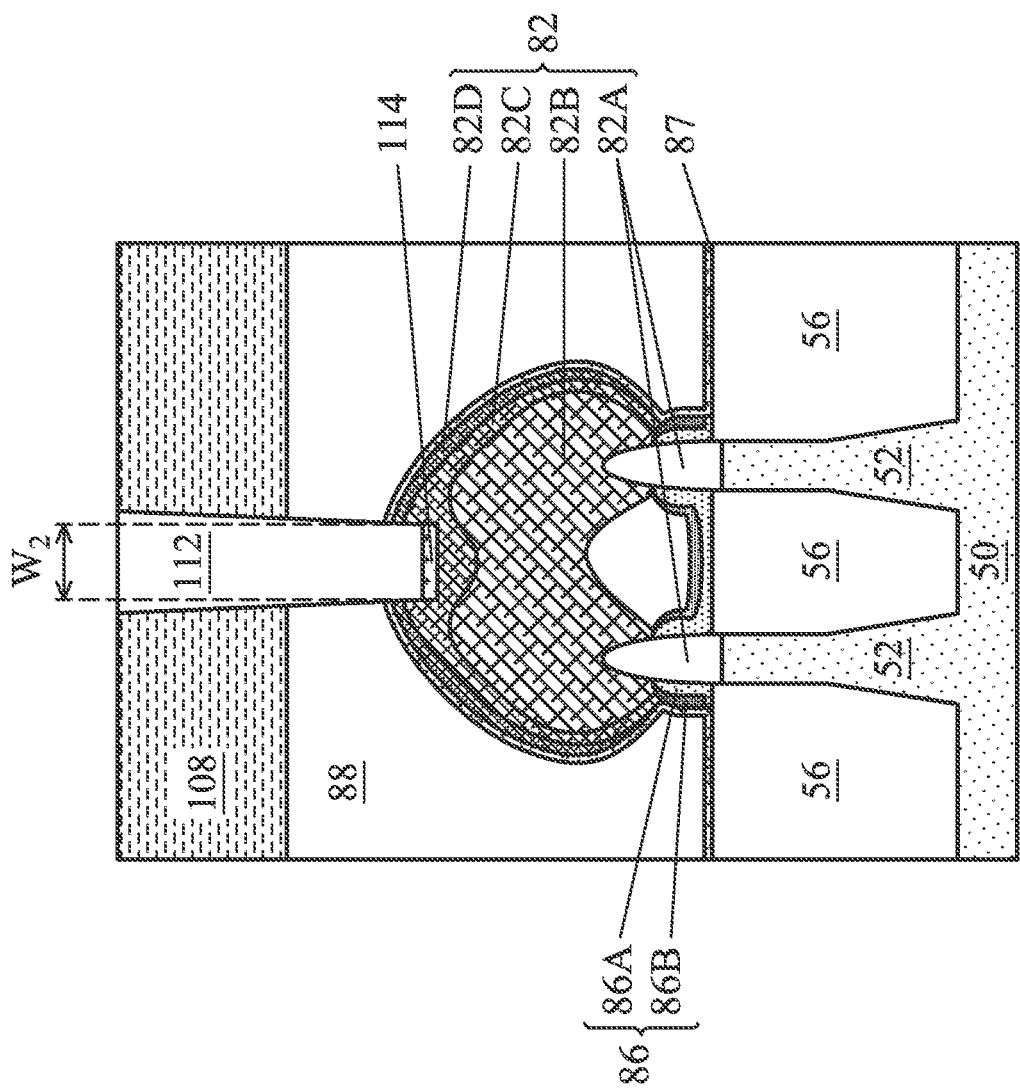
FIG. 19C is a cross-sectional view of a FinFET in accordance with some embodiments.

FIG. 19C is a cross-sectional view of a FinFET in accordance with some embodiments. FIG. 19C is illustrated along the reference cross-section C-C illustrated in FIG. 1, except for multiple fins/FinFETs. A structure illustrated in FIG. 19C is similar to a structure shown in FIG. 18C, with similar features labeled by similar numerical references, and the description of the similar features is not repeated herein. In some embodiments, the structure illustrated in FIG. 19C may be formed using process steps described above with reference to FIGS. 2, 3, 4, 5, 6, 7, 8A, 8B, 9A, 9B, 10A, 10B, 10C, 10D, 11B, 11C, 12A, 12B, 13A, 13B, 14A, 14B, 15A, 15B, 15C, 16A, 16B, 17A, and 17B, and the description is not repeated herein. In the illustrated embodiment, a width $W_2$ of the source/drain contact 112 at the interface between the source/drain contact 112 and the respective epitaxial source/drain region 82 may be less than the pitch of the fins 52. In some embodiments, the width $W_2$ is between about 5 nm and about 20 nm.

Figure 20C:
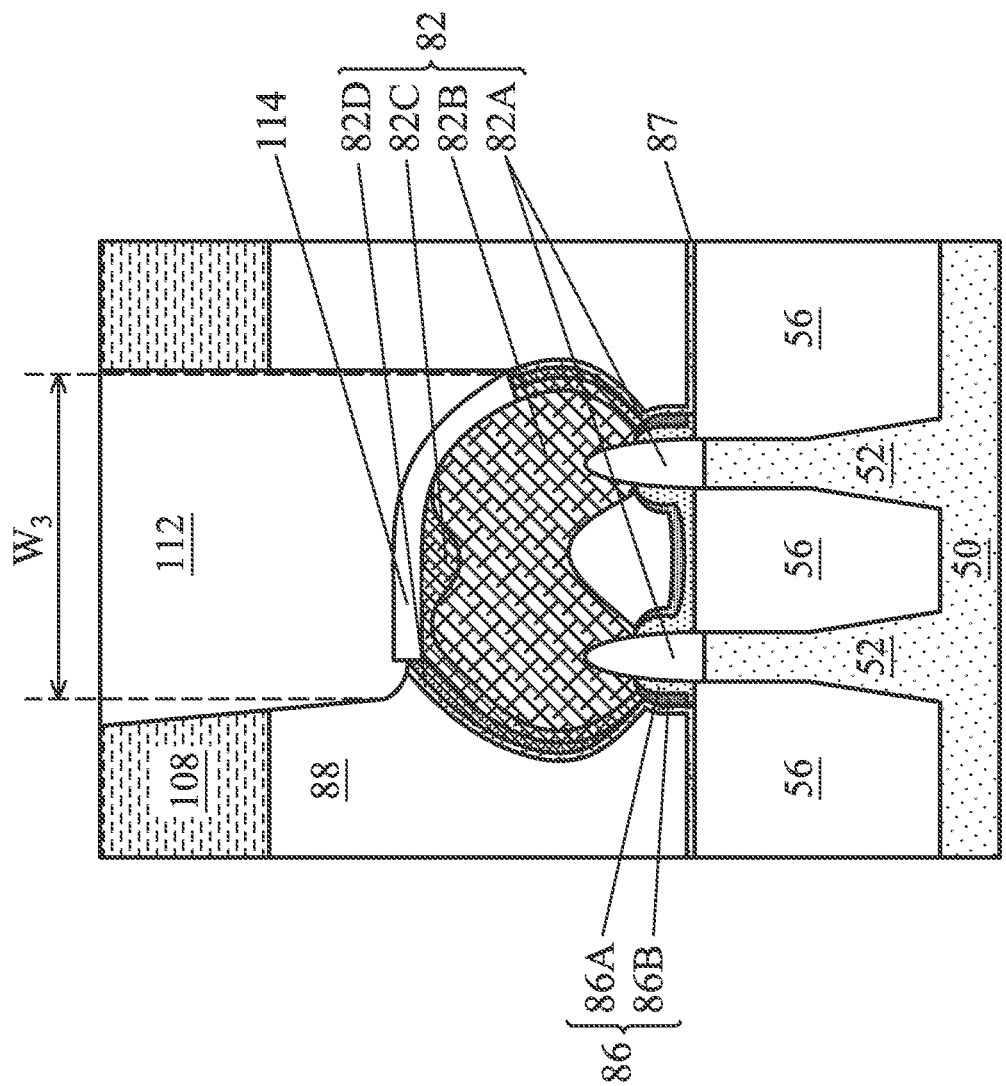
FIG. 20C is a cross-sectional view of a FinFET in accordance with some embodiments.

FIG. 20C is a cross-sectional view of a FinFET in accordance with some embodiments. FIG. 20C is illustrated along the reference cross-section C-C illustrated in FIG. 1, except for multiple fins/FinFETs. A structure illustrated in FIG. 20C is similar to a structure shown in FIG. 18C, with similar features labeled by similar numerical references, and the description of the similar features is not repeated herein. In some embodiments, the structure illustrated in FIG. 20C may be formed using process steps described above with reference to FIGS. 2, 3, 4, 5, 6, 7, 8A, 8B, 9A, 9B, 10A, 10B, 10C, 10D, 11B, 11C, 12A, 12B, 13A, 13B, 14A, 14B, 15A, 15B, 15C, 16A, 16B, 17A, and 17B, and the description is not repeated herein. In the illustrated embodiment, a width $W_3$ of the source/drain contact 112 at the interface between the source/drain contact 112 and the respective epitaxial source/drain region 82 may be greater than the pitch of the fins 52. In some embodiments, the width $W_3$ is between about 60 nm and about 100 nm.

Figure 21:
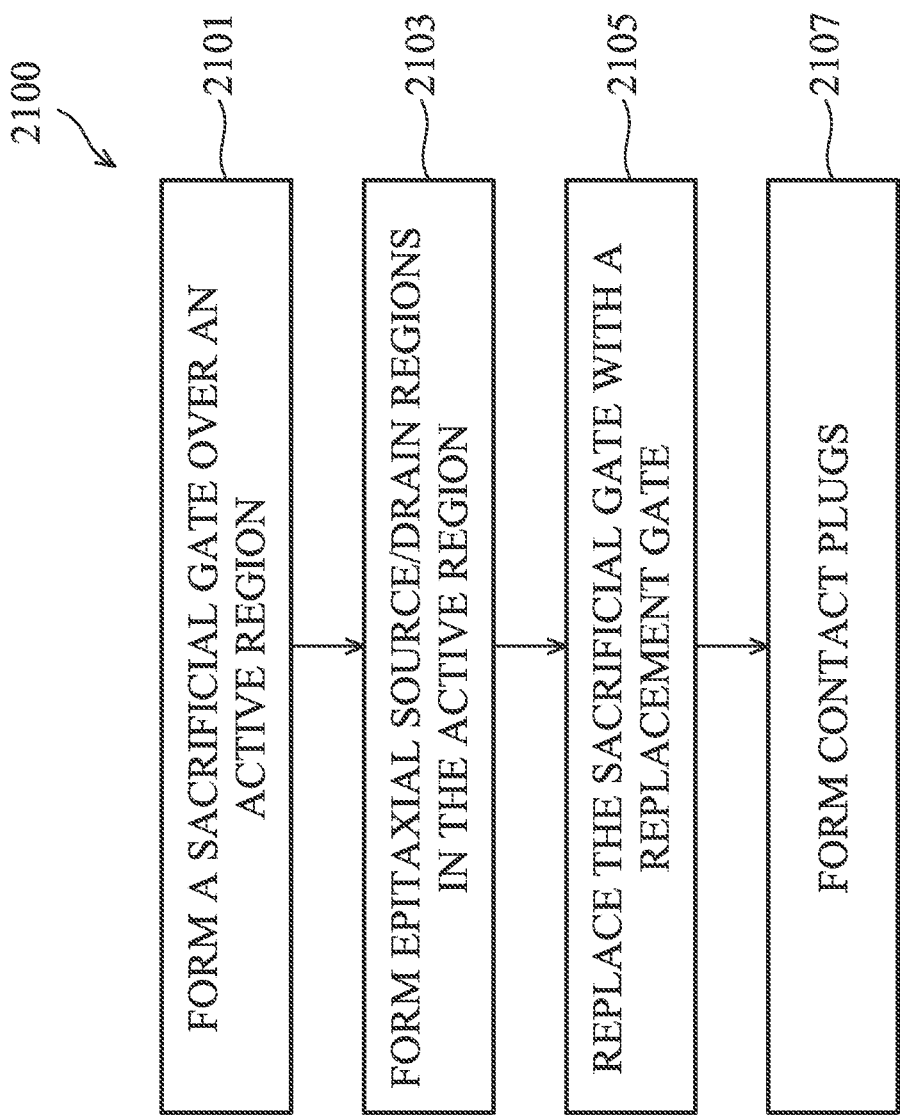
FIG. 21 is a flow diagram illustrating a method of forming a semiconductor device in accordance with some embodiments.

FIG. 21 is a flow diagram illustrating a method 2100 of forming a semiconductor device in accordance with some embodiments. The method 2100 starts with step 2101, where a sacrificial gate (such as the dummy gate 72 illustrated in FIGS. 8A and 8B) is formed over an active region (such as the fins 52 illustrated in FIGS. 8A and 8B) as described above with reference to FIGS. 2, 3, 4, 5, 6, 7, 8A, and 8B. In step 2103, epitaxial source/drain regions (such as the epitaxial source/drain regions 82 illustrated in FIGS. 11B and 11C) are formed in the active region as described above with reference to FIGS. 9A, 9B, 10A, 10B, 10C, 10D, 11B, and 11C. In step 2105, the sacrificial gate is replaced with a replacement gate (such as the gate electrode 94 and the gate dielectric layer 92 illustrated in FIGS. 15A, 15B, and 15C) as described above with reference to FIGS. 12A, 12B, 13A, 13B, 14A, 14B, 15A, 15B, 15C. In step 2107, contact plugs (such as the source/drain contacts 112 and the gate contacts 110 illustrated in FIGS. 17A and 17B) are formed as described above with reference to FIGS. 16A, 16B, 17A, and 17B.

In accordance with an embodiment, a device includes a gate stack over an active region and a source/drain region in the active region adjacent the gate stack. The source/drain region includes a first semiconductor layer having a first germanium concentration and a second semiconductor layer over the first semiconductor layer. The second semiconductor layer has a second germanium concentration greater than the first germanium concentration. The source/drain region further includes a third semiconductor layer over the second semiconductor layer and a fourth semiconductor layer over the third semiconductor layer. The third semiconductor layer has a third germanium concentration greater than the second germanium concentration. The fourth semiconductor layer has a fourth germanium concentration less than the third germanium concentration. In an embodiment, the source/drain region includes silicon. In an embodiment, the first semiconductor layer has a first boron concentration. In an embodiment, the second semiconductor layer has a second boron concentration greater than the first boron concentration. In an embodiment, the third semiconductor layer has a third boron concentration greater than the second boron concentration. In an embodiment, the fourth semiconductor layer has a fourth boron concentration less than the third boron concentration. In an embodiment, the device further includes a contact plug electrically coupled to the source/drain region, the contact plug extending through the fourth semiconductor layer and into the third semiconductor layer. In an embodiment, the first semiconductor layer includes a plurality of disconnected portions. In an embodiment, the second semiconductor layer includes a continuous layer extending between adjacent disconnected portions of the first semiconductor layer. In an embodiment, a portion of the third semiconductor layer is interposed between portions of the second semiconductor layer.

In accordance with another embodiment, a device includes a gate stack over an active region and an epitaxial source/drain region in the active region adjacent the gate stack. The epitaxial source/drain region includes silicon germanium. The epitaxial source/drain region includes a first semiconductor layer having a first boron concentration and a second semiconductor layer over the first semiconductor layer. The second semiconductor layer has a second boron concentration greater than the first boron concentration. The epitaxial source/drain region further includes a third semiconductor layer over the second semiconductor layer and a fourth semiconductor layer over the third semiconductor layer. The third semiconductor layer has a third boron concentration greater than the second boron concentration. The fourth semiconductor layer has a fourth boron concentration less than the third boron concentration. The device further includes a contact plug over the epitaxial source/drain region. The contact plug extends through the fourth semiconductor layer and into the third semiconductor layer. In an embodiment, the first semiconductor layer has a first germanium concentration. In an embodiment, the second semiconductor layer has a second germanium concentration greater than the first germanium concentration. In an embodiment, the third semiconductor layer has a third germanium concentration greater than the second germanium concentration. In an embodiment, the fourth semiconductor layer has a fourth germanium concentration less than the third germanium concentration. In an embodiment, the device further includes a silicide layer between the contact plug and the third semiconductor layer, a topmost surface of the silicide layer being below a topmost surface of the third semiconductor layer.

In accordance with yet another embodiment, a method includes: forming a gate stack over an active region; forming an opening in the active region adjacent the gate stack; and forming a source/drain region in the opening. Forming the source/drain region includes: epitaxially growing a first semiconductor layer along a bottom and sidewalls of the opening, the first semiconductor layer having a first germanium concentration; epitaxially growing a second semiconductor layer over the first semiconductor layer, the second semiconductor layer having a second germanium concentration greater than the first germanium concentration; epitaxially growing a third semiconductor layer over the second semiconductor layer, the third semiconductor layer having a third germanium concentration greater than the second germanium concentration; and epitaxially growing a fourth semiconductor layer over the third semiconductor layer, the fourth semiconductor layer having a fourth germanium concentration less than the third germanium concentration. In an embodiment, epitaxially growing the first semiconductor layer further includes in situ doping the first semiconductor layer with boron, the first semiconductor layer having a first boron concentration. In an embodiment, epitaxially growing the second semiconductor layer further includes in situ doping the second semiconductor layer with boron, the second semiconductor layer having a second boron concentration greater than the first boron concentration. In an embodiment, epitaxially growing the third semiconductor layer further includes in situ doping the third semiconductor layer with boron, the third semiconductor layer having a third boron concentration greater than the second boron concentration. In an embodiment, epitaxially growing the fourth semiconductor layer further includes in situ doping the fourth semiconductor layer with boron, the third semiconductor layer having a fourth boron concentration less than the third boron concentration. In an embodiment, the method further includes forming a contact plug over the source/drain region, the contact plug extending through the fourth semiconductor layer and into the third semiconductor layer. In an embodiment, the method further includes, before forming the contact plug, forming a silicide layer over and in physical contact with the third semiconductor layer, the silicide layer being interposed between the contact plug and the third semiconductor layer.

In accordance with yet another embodiment, a device includes: a source/drain region in an active region of a substrate, the source/drain region including: a first semiconductor layer having a first germanium concentration, wherein the first semiconductor layer includes a plurality of disconnected portions; a second semiconductor layer over the first semiconductor layer, the second semiconductor layer having a second germanium concentration greater than the first germanium concentration, wherein the second semiconductor layer includes a continuous layer extending between adjacent disconnected portions of the first semiconductor layer; a third semiconductor layer over the second semiconductor layer, the third semiconductor layer having a third germanium concentration greater than the second germanium concentration; and a fourth semiconductor layer over the third semiconductor layer, the fourth semiconductor layer having a fourth germanium concentration less than the third germanium concentration.

In accordance with yet another embodiment, a device includes: an epitaxial source/drain region in an active region of a substrate, the epitaxial source/drain region including silicon germanium, the epitaxial source/drain region further including: a first semiconductor layer having a first boron concentration; a second semiconductor layer over the first semiconductor layer, the second semiconductor layer having a second boron concentration greater than the first boron concentration; a third semiconductor layer over the second semiconductor layer, the third semiconductor layer having a third boron concentration greater than the second boron concentration; and a fourth semiconductor layer over the third semiconductor layer, the fourth semiconductor layer having a fourth boron concentration less than the third boron concentration.

In accordance with yet another embodiment, a method includes: forming a gate stack over an active region of a substrate; forming an opening in the active region adjacent the gate stack; and forming a source/drain region in the opening, the source/drain region including silicon germanium, forming the source/drain region including: epitaxially growing a first semiconductor layer along a bottom and sidewalls of the opening, the first semiconductor layer having a first boron concentration; epitaxially growing a second semiconductor layer over the first semiconductor layer, the second semiconductor layer having a second boron concentration greater than the first boron concentration; epitaxially growing a third semiconductor layer over the second semiconductor layer, the third semiconductor layer having a third boron concentration greater than the second boron concentration; and epitaxially growing a fourth semiconductor layer over the third semiconductor layer, the fourth semiconductor layer having a fourth boron concentration less than the third boron concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a gate stack over an active region;
   forming an opening in the active region adjacent the gate stack;
   forming a source/drain region in the opening, forming the source/drain region comprising:
   epitaxially growing a first semiconductor layer, the first semiconductor layer having a first germanium concentration;
   epitaxially growing a second semiconductor layer over the first semiconductor layer, the second semiconductor layer having a second germanium concentration greater than the first germanium concentration; and
   epitaxially growing a third semiconductor layer over the second semiconductor layer, the third semiconductor layer having a third germanium concentration less than the second germanium concentration, wherein the first semiconductor layer, the second semiconductor layer, and the third semiconductor layer are silicon germanium layers; and forming a contact plug over the source/drain region, the contact plug extending into the second semiconductor layer.

2. The method of claim 1, further comprising:

forming a first fin and a second fin, wherein the active region is a portion of the first fin, wherein the first semiconductor layer extends continuously from over the first fin to over the second fin.

3. The method of claim 2, wherein a width of a bottom surface of the contact plug is less than a distance between the first fin and the second fin.

4. The method of claim 1, wherein the second semiconductor layer completely separates a bottom surface of the contact plug from the first semiconductor layer.

5. The method of claim 1, wherein the second semiconductor layer has a greater boron concentration than the first semiconductor layer, and wherein the third semiconductor layer has a lesser boron concentration than the second semiconductor layer.

6. The method of claim 1, further comprising, prior to epitaxially growing the first semiconductor layer, epitaxially growing a fourth semiconductor layer along a bottom and sidewalls of the opening, wherein the first semiconductor layer is over the fourth semiconductor layer.

7. The method of claim 6, the fourth semiconductor layer having a fourth germanium concentration less than the first germanium concentration.

8. The method of claim 7, wherein the fourth semiconductor layer has a boron concentration less than the first semiconductor layer.

9. A method of forming a semiconductor device, the method comprising:

forming a first fin;

forming a gate stack over the first fin;

forming a first recess in the first fin adjacent the gate stack;

epitaxially growing a source/drain region in the first recess of the first fin, the source/drain region comprising silicon germanium, wherein growing the source/drain region comprises:

epitaxially growing a first semiconductor layer in the first recess, the first semiconductor layer having a first boron concentration;

epitaxially growing a second semiconductor layer over the first semiconductor layer, the second semiconductor layer having a second boron concentration greater than the first boron concentration; and epitaxially growing a third semiconductor layer over the second semiconductor layer, the third semiconductor layer having a third boron concentration less than the second boron concentration; and forming a contact plug over the source/drain region, the contact plug extending through the third semiconductor layer and into the second semiconductor layer.

10. The method of claim 9, further comprising:

epitaxially growing a fourth semiconductor layer directly on a surface of the first recess, the fourth semiconductor layer having a fourth boron concentration, the fourth boron concentration being less than the first boron concentration.

11. The method of claim 10, wherein forming the first semiconductor layer comprises forming the first semiconductor layer directly on the fourth semiconductor layer.

12. The method of claim 9, further comprising, prior to forming the contact plug, forming a silicide layer over the source/drain region.

13. The method of claim 12, wherein the second semiconductor layer completely separates the silicide layer from the first semiconductor layer.

14. The method of claim 12, wherein the silicide layer extends to the first semiconductor layer.

15. The method of claim 9, wherein the first semiconductor layer has a first germanium concentration, wherein the second semiconductor layer has a second germanium concentration greater than the first germanium concentration, and wherein the third semiconductor layer has a third germanium concentration less than the second germanium concentration.

16. A semiconductor device comprising:

a first fin;

a gate stack over the first fin;

a source/drain region in a recess in the first fin adjacent the gate stack, the source/drain region comprising:

a first semiconductor layer in the recess, the first semiconductor layer having a first germanium concentration, wherein the first semiconductor layer has a first p-type dopant concentration;

a second semiconductor layer over the first semiconductor layer, the second semiconductor layer having a second germanium concentration greater than the first germanium concentration, wherein the second semiconductor layer has a second p-type dopant concentration greater than the first p-type dopant concentration; and a third semiconductor layer over the second semiconductor layer, the third semiconductor layer having a third germanium concentration less than the second germanium concentration, wherein the third semiconductor layer has a third p-type dopant concentration less than the second p-type dopant concentration;

a dielectric layer over the source/drain region; and a contact extending through the third semiconductor layer and into the second semiconductor layer.

17. The semiconductor device of claim 16, further comprising:

a second fin; and a first semiconductor material portion over the first fin and a second semiconductor material portion over the second fin, wherein the first semiconductor layer extends continuously over the first semiconductor material portion and the second semiconductor material portion.

18. The semiconductor device of claim 17, wherein the first semiconductor material portion and the second first semiconductor material portion have a fourth germanium concentration less than the first germanium concentration, wherein the first semiconductor material portion and the second semiconductor material portion have a fourth p-type dopant concentration less than the first p-type dopant concentration.

19. The semiconductor device of claim 17, wherein the first semiconductor material portion is spaced apart from the second semiconductor material portion.

20. The semiconductor device of claim 16, wherein the second semiconductor layer extends completely under the contact.

* * * * *